United States Patent
Momose

(10) Patent No.: US 9,229,068 B2
(45) Date of Patent: Jan. 5, 2016

(54) MAGNETIC SENSOR DEVICE

(71) Applicant: NIDEC SANKYO CORPORATION, Nagano (JP)

(72) Inventor: Shogo Momose, Nagano (JP)

(73) Assignee: NIDEC SANKYO CORPORATION (JP)

(*) Notice: Subject to any disclaimer, the term of this patent is extended or adjusted under 35 U.S.C. 154(b) by 439 days.

(21) Appl. No.: 13/719,855

(22) Filed: Dec. 19, 2012

(65) Prior Publication Data
US 2013/0154634 A1  Jun. 20, 2013

(30) Foreign Application Priority Data

Dec. 20, 2011 (JP) ................. 2011-278624

(51) Int. Cl.
| | |
|---|---|
| *G01R 33/00* | (2006.01) |
| *G01R 33/10* | (2006.01) |
| *G11B 5/008* | (2006.01) |
| *G01R 33/07* | (2006.01) |
| *G07D 7/04* | (2006.01) |

(52) U.S. Cl.
CPC ........ *G01R 33/0052* (2013.01); *G01R 33/0094* (2013.01); *G01R 33/072* (2013.01); *G01R 33/10* (2013.01); *G07D 7/04* (2013.01); *G11B 5/00804* (2013.01)

(58) Field of Classification Search
CPC .................................................. G01R 33/0052
See application file for complete search history.

(56) References Cited

U.S. PATENT DOCUMENTS

| | | | | |
|---|---|---|---|---|
| 5,543,973 A | * | 8/1996 | Moriyama | ........................ 360/17 |
| 2010/0308113 A1 | * | 12/2010 | Momose | ........................ 235/450 |

FOREIGN PATENT DOCUMENTS

JP      2009-163336 A      7/2009

* cited by examiner

*Primary Examiner* — Patrick Assouad
*Assistant Examiner* — Haidong Zhang
(74) *Attorney, Agent, or Firm* — Cantor Colburn LLP

(57) ABSTRACT

A magnetic sensor device may include a magnetic sensor element structured to detect a magnetic property of a medium. The magnetic sensor element may include a sensor core having a body part and one or a plurality of protruded part(s) which is protruded from the body part, an exciting coil which is wound around the sensor core, and a detection coil which is wound around the sensor core. The body part and the protruded part of the sensor core forms an open magnetic path, and a stepped part is formed on a side face of at least one piece of the protruded part.

18 Claims, 14 Drawing Sheets

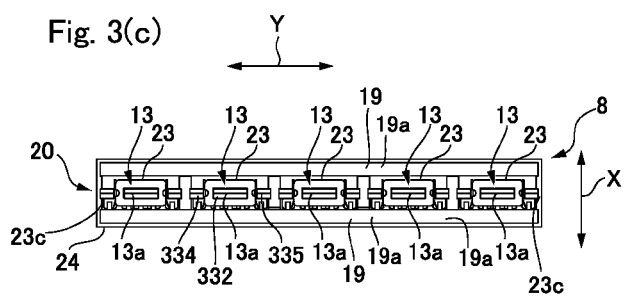
Fig. 3(c)
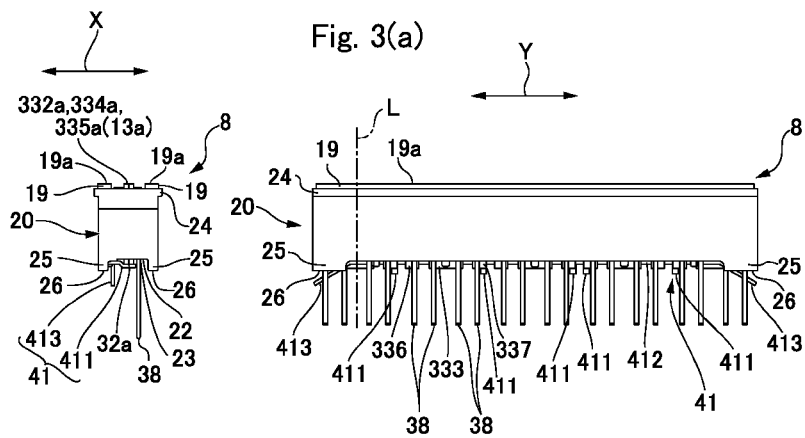
Fig. 3(b)
Fig. 3(a)

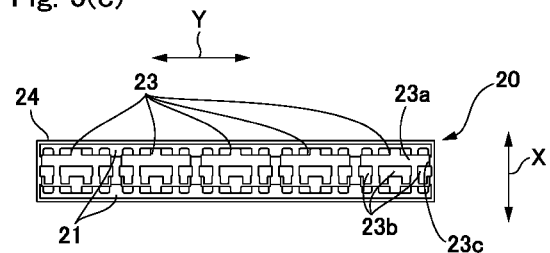
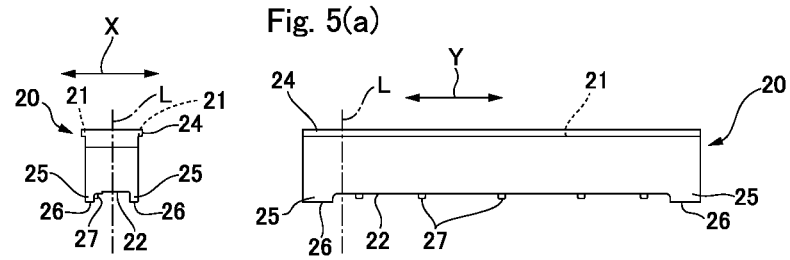
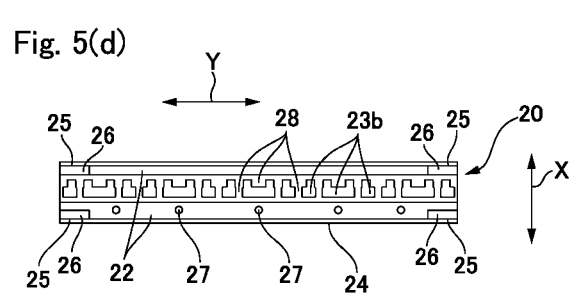

Fig. 10(b)
Fig. 10(a)
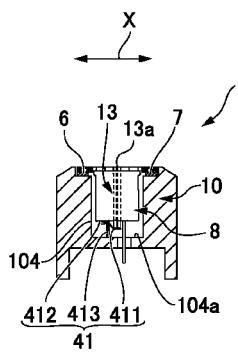
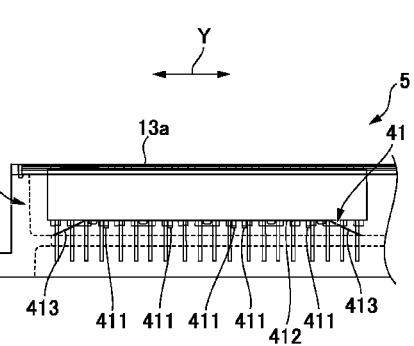
Fig. 11(b)
Fig. 11(a)
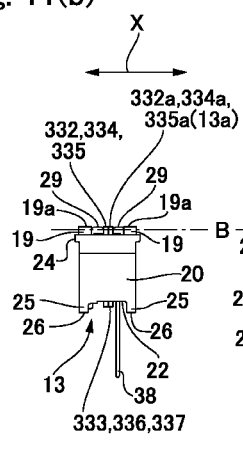
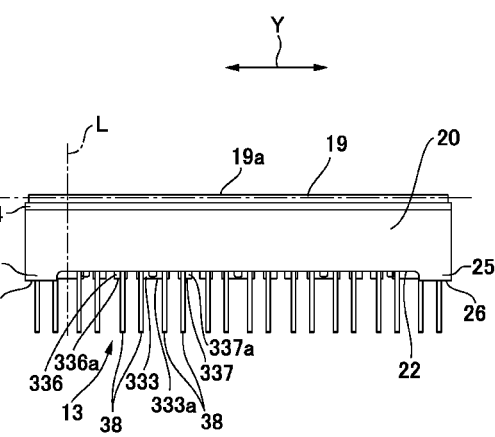

MAGNETIC SENSOR DEVICE

CROSS REFERENCE TO RELATED APPLICATION

The present invention claims priority under 35 U.S.C. §119 to Japanese Application No. 2011-278624 filed Dec. 20, 2011, the entire content of which is incorporated herein by reference.

FIELD OF THE INVENTION

At least an embodiment of the present invention may relate to a magnetic sensor device which includes a magnetic sensor element for detecting a magnetic property of a medium.

BACKGROUND

A magnetic pattern detection device for detecting a magnetic pattern of a medium which is carried along a medium feeding face has been known which includes a magnet structured to magnetize the medium and a magnetic sensor device structured to read a magnetic pattern of the medium that is magnetized by the magnet. The magnetic sensor device (magnetic pattern detection device) described in Japanese Patent Laid-Open No. 2009-163336 includes a plate-shaped sensor core made of a magnetic body such as amorphous metal or permalloy, and a coil wire is wound around the sensor core to structure an exciting coil for generating a bias magnetic field and a detection coil for detecting the magnetic pattern.

In the above-mentioned Patent Literature, one of end faces of the sensor core is a sensing face (magneto-sensitive face) of the magnetic sensor device and the sensing face is disposed on the same plane as the medium feeding face. In order to detect the magnetic pattern of a medium with a high degree of accuracy, it is preferable that a distance between the sensing face and a medium is set to be small for increasing the sensor sensitivity. Therefore, the end part on a medium side of the sensor core is commonly cut or ground for adjusting a length of the end part and a distance between the sensing face and a medium is set to be an optimum dimension.

However, a cutting work or a grinding work as described above is performed on an end part on a medium side of the sensor core, variation is occurred in the dimension of the sensor core due to the work and the magnetic circuit is varied. Therefore, the sensor characteristics such as the sensor sensitivity or the current efficiency are varied depending on the variation of the dimension of the sensor core and the stable sensor characteristics are not obtained.

SUMMARY

In view of the problem described above, at least an embodiment of the present invention may advantageously provide a magnetic sensor device in which variation of sensor characteristics due to variation of the dimension of the sensor core is small and stable sensor characteristics are obtained.

According to at least an embodiment of the present invention, there may be provided a magnetic sensor device including a magnetic sensor element structured to detect a magnetic property of a medium. The magnetic sensor element includes a sensor core having a body part and one or a plurality of protruded part(s) which is protruded from the body part, an exciting coil and a detection coil which are wound around the sensor core, and the body part and the protruded part of the sensor core forms an open magnetic path, and a stepped part is formed on a side face of at least one piece of the protruded part.

According to at least an embodiment of the present invention, since a stepped part is formed in the protruded part which forms an open magnetic path, magnetic flux which is short-cut by the stepped part is increased to reduce magnetic flux passing through the tip end side with respect to the stepped part and thus the magnetic flux is concentrated on the portion near the body part. As a result, influence of the tip end shape of the protruded part on the magnetic circuit of the magnetic sensor element is reduced and thus variation of the sensor characteristics due to dimensional variation of the protruded part in the sensor core is reduced. Therefore, the sensor characteristics can be stabilized.

In accordance with at least an embodiment of the present invention, a tip end face of the protruded part where the stepped part is formed is a sensing face of the magnetic sensor element. According to this structure, even when a length of the protruded part is adjusted for setting a distance between the sensing face (magneto-sensitive face) and a detection object (medium on which a magnetic pattern is magnetized) to an optimum dimension and, as a result, variation is occurred in the dimension of the protruded part, variation of the sensor characteristics is reduced. Therefore, the sensor characteristics are stabilized while improving the sensor sensitivity.

Further, in accordance with at least an embodiment of the present invention, a tip end face of the protruded part where the stepped part is formed is a grounding face for being contacted with an electrical conduction member for grounding. In this case, it is preferable that the protruded part where the stepped part is formed is protruded from the body part to a side opposite to the sensing face of the magnetic sensor element. According to this structure, even when the tip end of the protruded part is worked so that the sensor core and an electrical conduction member are capable of being contacted with each other and, as a result, variation is occurred in the dimension of the protruded part, variation of the sensor characteristics is reduced. Therefore, the sensor characteristics are stabilized while a countermeasure against an electrostatic noise in the magnetic sensor element is performed.

Further, in accordance with at least an embodiment of the present invention, the protruded part is protruded from one of edges of the body part, another protruded part is protruded from the other of the edges of the body part to an opposite direction, a tip end face of the protruded part protruded from the one of the edges is a sensing face of the magnetic sensor element and a tip end face of the protruded part protruded from the other of the edges is a grounding face for being contacted with an electrical conduction member for grounding. In addition, the stepped part is formed on a side face of at least one of the protruded part where the sensing face is formed and the protruded part where the grounding face is formed. According to this structure, even when both ends of the sensor core are worked for increasing the sensor sensibility and for grounding, variation of the sensor characteristics due to variation of the dimension of the sensor core caused by the working is reduced. Therefore, the sensor characteristics can be stabilized while a countermeasure against an electrostatic noise is performed. Specifically, it may be structured that the protruded part which structures the sensing face of the magnetic sensor element includes a center protruded part and a first protruded part and a second protruded part which are disposed on both sides with respect to the center protruded part, and the center protruded part, the first protruded part and the second protruded part are protruded in the same direction from the body part, and the center protruded part and the first protruded part and the second protruded part are extended in a straight shape so as to be parallel to each other, and the protruded part which is protruded from the other of the edges includes a center protruded part and a first protruded part and a second protruded part which are disposed on both sides with respect to the center protruded part, and the center protruded part, the first protruded part and the second protruded part are protruded in the same direction from the body part, and the center protruded part and the first protruded part and the second protruded part are extended in a straight shape so as to be parallel to each other.

In this case, it is desirable that a portion on a tip end side of the protruded part with respect to the stepped part is formed so that a width dimension in a direction perpendicular to the protruding direction of the protruded part from the body part is thinner than the width dimension of a portion on the body part side of the protruded part with respect to the stepped part. When the tip end portion of the protruded part is set to be thinner from the position of the stepped part as described above, magnetic flux is effectively short-cut and thus the magnetic flux passing through the tip end side from the stepped part is reduced and influence to the magnetic circuit of the tip end portion is reduced. Therefore, variation of the sensor characteristics due to the dimensional variation of the protruded part is reduced. Specifically, it may be structured that the protruded part where the stepped part is formed includes lower side face portions which structure both side faces in a widthwise direction of a root part which is disposed on the body part side of the protruded part, stepped face portions as the stepped part which are extended upward from upper ends of the lower side face portions while curved to inner sides in the widthwise direction of the protruded part, and side face tip end portions which are extended from upper ends of the stepped face portions in a straight line shape to the tip end face of the protruded part, and the width dimension between the side face tip end portions is thinner than the width dimension between the lower side face portions. Further, it may be structured that the protruded part which structures the sensing face of the magnetic sensor element includes a center protruded part and a first protruded part and a second protruded part which are disposed on both sides with respect to the center protruded part, and the center protruded part, the first protruded part and the second protruded part are protruded in the same direction from the body part, and the center protruded part and the first protruded part and the second protruded part are extended in a straight shape so as to be parallel to each other, and a width dimension in a direction, which is perpendicular to the protruding direction from the body part, of a portion extended in a straight shape of the center protruded part on the tip end side with respect to the stepped part is thinner than a portion extended in a straight shape of the center protruded part on the body part side with respect to the stepped part.

Further, it is desirable that the exciting coil is wound around the body part, and the detection coil is wound around a portion on the tip end side of the protruded part with respect to the stepped part, the portion on the tip end side being extended in a straight line shape, for example, the detection coil is wound around the side face tip end portion. According to this structure, magnetic field by the exciting coil is short-cut by the stepped part to concentrate on the vicinity of the body part and thus influence to the magnetic field for sensing (magnetic field to the detection coil) is reduced and a high degree of sensitivity can be obtained. Further, magnetic resistance is reduced by concentrating the magnetic field on the portion near the exciting coil and thus the current efficiency is improved. Therefore, a high degree of efficiency is attained. Accordingly, downsizing and power-saving of the magnetic sensor device can be attained. In this case, it may be structured that the magnetic sensor element includes a core body having a three layer structure which is comprised of a first and a second protection plates made of nonmagnetic material and the sensor core which is sandwiched by the first and the second protection plates, and the exciting coil and the detection coil are respectively wound around the core body through a coil bobbin. Further, it may be structured that the exciting coils are wound around the body part at two positions on both sides with respect to the two center protruded parts, and one of the exciting coils is disposed on an inner side with respect to the above-mentioned two first protruded parts and the other of the exciting coils is disposed on an inner side with respect to the above-mentioned two second protruded parts.

Further, in accordance with at least an embodiment of the present invention, the tip end face of the protruded part is a cutting worked face which is formed by cutting a sensor core substrate or a grinding worked face which is formed by grinding a sensor core substrate. According to at least an embodiment of the present invention, as described above, variation of the sensor characteristics due to the dimensional variation of the protruded part is small. Therefore, even when working such as cutting work or grinding work is performed on the tip end of the protruded part, the sensor characteristics are hard to be affected by the working accuracy. Accordingly, even when the sensing face is worked for providing no stepped part on the face where a sheet-shaped medium such as a bank note and a valuable security is passed so that the sheet-shaped medium is not caught, or for setting a distance between the medium and the sensing face to a dimension for a high degree of sensor sensitivity, stable sensor characteristics can be obtained.

In accordance with at least an embodiment of the present invention, the sensor core is provided with a plurality of the protruded parts which are protruded to the same side from the body part, at least one of side faces facing each other of the two protruded parts adjacent to each other is formed with the stepped part, and a width of a gap between the side faces facing each other at a position on the tip end side with respect to the stepped part is wider than its width at a position on the body part side with respect to the stepped part. According to this structure, since the magnetic flux which is short-cut to the adjacent protruded part in the stepped part is increased to reduce the magnetic flux passing through the tip end side, influence of the tip end shape of the protruded part to the magnetic circuit is reduced.

In this case, it is desirable that the sensor core is formed with at least three protruded parts juxtaposed in one row so as to be protruded to the same side from the body part, the protruded part disposed at a center position is formed with a stepped part on both side faces which face the adjacent protruded parts disposed on both sides, the widths of gaps between the protruded part disposed at the center position and the adjacent protruded parts disposed on the both sides are wider at a position on the tip end side with respect to the stepped part than the widths of the gaps at a position on the body part side with respect to the stepped part. According to this structure, the magnetic field is concentrated on the side of the body part without changing the symmetric property of the magnetic fields which are symmetrically formed so as to interpose the center protruded part. Further, since the stepped part is formed on both side faces of the protruded part disposed at a center position, the width of the portion of the protruded part which may affect the magnetic field on both sides is made thinner and thus influence to the magnetic circuit of the portion can be reduced.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 3(a), 3(b) and 3(c) are a front view, a side view and a top plan view showing the magnetic sensor device.

FIGS. 5(a), 5(b), 5(c) and 5(d) are a front view, a side view, a top plan view and a bottom view of a frame.

FIGS. 10(a) and 10(b) are explanatory views showing the magnetic sensor device which is inserted into a case.

FIGS. 11(a) and 11(b) are explanatory views showing the magnetic sensor device in the course of manufacturing.

DETAILED DESCRIPTION OF THE PREFERRED EMBODIMENTS

A magnetic pattern detection device on which a magnetic sensor device to which the present invention is applied is mounted will be described below with reference to the accompanying drawings.

(Entire Structure)

Figure 1:
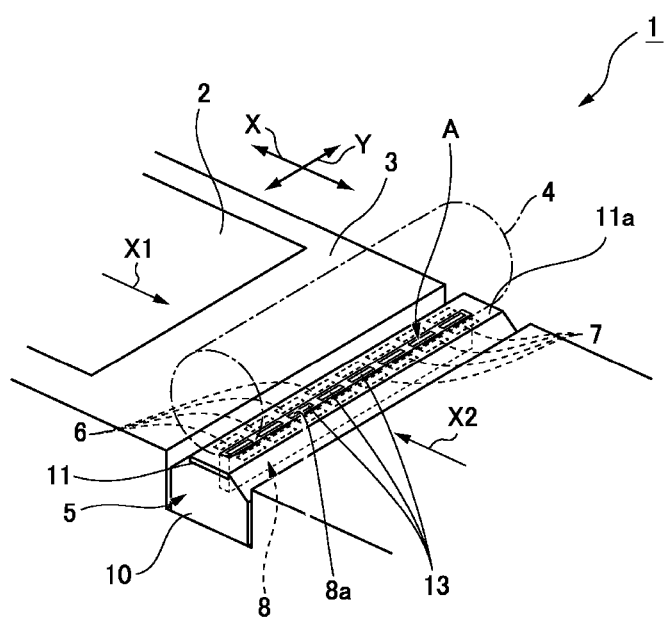
FIG. 1 is an explanatory perspective view showing a magnetic pattern detection device on which a magnetic sensor device in accordance with an embodiment of the present invention is mounted.

FIG. 1 is an explanatory perspective view showing a magnetic pattern detection device on which a magnetic sensor device to which the present invention is applied is mounted. As shown in FIG. 1, a magnetic pattern detection device 1 includes a medium feeding mechanism 4 for carrying a sheet-shaped medium 2 such as a bank note or a valuable security along a medium feeding path 3 and a magnetic sensor unit 5 for detecting a magnetic pattern of the medium 2 at a magnetism reading position "A" which is provided on the medium feeding path 3. In the following descriptions, for convenience, upper and lower sides for respective members will be described depending on the upper and lower direction in the drawing.

(Magnetic Sensor Unit)

Figure 2A:
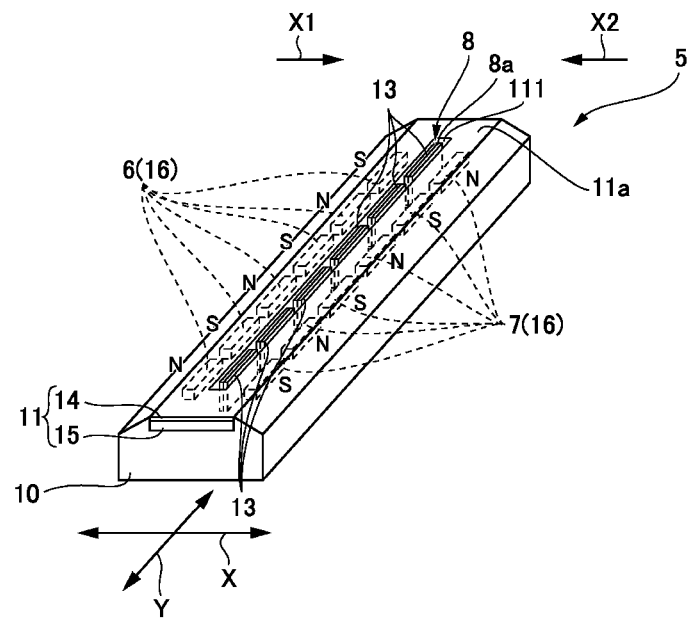
FIGS. 2(a) and 2(b) are explanatory views showing a magnetic sensor unit in accordance with an embodiment of the present invention.
Figure 2B:
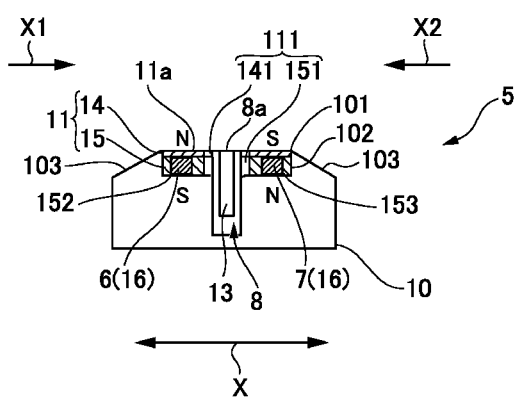

FIG. 2(a) is a perspective view showing a layout of a first magnetizing magnet, a second magnetizing magnet and a magnetic sensor device in the magnetic sensor unit 5 and FIG. 2(b) is a cross sectional view showing the magnetic sensor unit 5. In FIGS. 2(a) and 2(b), in order to describe arrangement of a cover plate, the first magnetizing magnet and the second magnetizing magnet, a structure of the magnetic sensor device is schematically shown.

The medium feeding mechanism 4 carries a medium 2 in two directions (medium feeding direction "X"), i.e., a first direction "X1" and a second direction "X2" which is the reverse direction to the first direction "X1". The magnetic sensor unit 5 includes a first magnetizing magnet 6, which magnetizes a medium 2 passing the magnetism reading position "A" in the first direction "X1", a second magnetizing magnet 7, which magnetizes a medium 2 passing the magnetism reading position "A" in the second direction "X2" that is opposite to the first direction "X1", and a magnetic sensor device 8 which reads a magnetic pattern of the medium 2 passing the magnetism reading position "A" in a state that the medium 2 is magnetized by the first magnetizing magnet 6 or the second magnetizing magnet 7.

Further, the magnetic sensor unit 5 includes a case 10 on which the magnetic sensor device 8 is mounted and a rectangular cover plate 11 which is attached to an upper end portion of the case 10. The first magnetizing magnet 6 and the second magnetizing magnet 7 are held on a rear face side of the cover plate 11. The cover plate 11 covers the upper faces of the first and the second magnetizing magnets 6 and 7 so that the first and the second magnetizing magnets 6 and 7 are not abraded by a medium 2 passing through the magnetism reading position "A".

The case 10 is formed of electrically conductive material such as metal. As shown in FIG. 2(b), a rectangular recessed part 102 for attaching the cover plate 11 is formed in a center portion of the upper end face 101 of the case 10 in the medium feeding direction "X". An inclined face 103 is formed on both sides of the recessed part 102 in the medium feeding direction "X" so as to be inclined downward toward the outer sides.

The recessed part 102 is provided with a constant depth and is extended with a constant width in the "Y" direction which is perpendicular to the medium feeding direction "X". The magnetic sensor device 8 is structured in the center portion in the medium feeding direction "X" of the recessed part 102. The upper end face of the magnetic sensor device 8 is a sensing face 8a. The sensing face 8a is located on the same plane as the upper end face 101 of the case 10. As shown in FIGS. 1 and 2(a), the magnetic sensor device 8 is provided with a plurality of magnetic sensor elements 13 which are arranged with a predetermined pitch in the "Y" direction which is perpendicular to the medium feeding direction "X".

As shown in FIGS. 2(a) and 2(b), the cover plate 11 is a composite plate comprised of a front face side cover plate 14 and a rear face side cover plate 15 which is superposed on and fixed to a rear face of the surface side cover plate 14. The surface of the front face side cover plate 14 is formed with a medium feeding face 11a for feeding a medium 2. The front face side cover plate 14 and the rear face side cover plate 15 are made of stainless steel. The front face side cover plate 14 and the rear face side cover plate 15 are diffusion-bonded to each other. In other words, the front face side cover plate 14 and the rear face side cover plate 15 are pressurized and heated in a tightly contacted state to be integrated with each other and the cover plate 11 becomes to be a plate with a high degree of rigidity as a whole.

The front face side cover plate 14 is a metal plate having a constant thickness in a thin plate shape which is formed in a rectangular contour shape. A rectangular opening part 141 is formed in its center portion in the medium feeding direction "X". For example, the opening part 141 is formed by etching. In this embodiment, a thickness dimension of the front face side cover plate 14 is not more than 0.3 mm and, preferably, about 0.1 mm.

The rear face side cover plate 15 is a metal plate having a constant thickness which is thicker than the front face side cover plate 14 and is formed in a contour shape which is the same as the front face side cover plate 14. The rear face side cover plate 15 is formed with an opening part 151 having the same shape as the opening part 141 at a position superposed on the opening part 141. For example, the opening part 151 is formed by etching. As shown in FIG. 2(b), the opening part 141 and the opening part 151 are superposed on each other to structure an opening part 111 of the cover plate 11. The rear face side cover plate 15 is formed in a thickness dimension which is the same as the thickness dimensions of the first magnetizing magnet 6 and the second magnetizing magnet 7. In this embodiment, the thickness dimension of the rear face side cover plate 15 is about 0.3-0.5 mm.

As shown in FIG. 2(a), the first magnetizing magnet 6 and the second magnetizing magnet 7 are structured of a plurality of magnet pieces 16 arranged in one row with a predetermined pitch in the "Y" direction which is perpendicular to the medium feeding direction "X". Each of the magnet pieces 16 structuring the first magnetizing magnet 6 and each of the magnet pieces 16 structuring the second magnetizing magnet 7 are mounted at a position superposing on each other when viewed in the medium feeding direction "X". The respective magnet pieces 16 are a permanent magnet such as a ferrite magnet or a neodymium magnet and are provided with the same magnetic force.

As shown in FIG. 2(b), the rear face side cover plate 15 is provided with a first mounting hole 152 formed at an upstream side position with respect to the opening part 151 in the first direction "X1" and a second mounting hole 153 formed at an upstream side position with respect to the opening part 151 in the second direction "X2". The respective magnet pieces 16 structuring the first magnetizing magnet 6 and the second magnetizing magnet 7 are fitted to the first mounting hole 152 and the second mounting hole 153 and are held by the rear face side cover plate 15 in an abutted state with the front face side cover plate 14.

Each of the magnet pieces 16 are mounted so that a magnetic pole on its front face side cover plate 14 side and a magnetic pole on its opposite side are different from each other and a face of the magnet piece 16 abutted with the front face side cover plate 14 functions as a magnetizing face to a medium 2 which is carried on the medium feeding face 11a. In this embodiment, each of the magnet pieces 16 is abutted with the front face side cover plate 14 and thus a gap between the medium feeding face 11a and each of the magnet pieces 16 is determined by a board thickness of the front face side cover plate 14.

After the cover plate 11 by which the first magnetizing magnet 6 and the second magnetizing magnet 7 are held is attached to the recessed part 102 of the case 10, a portion on the cover plate 11 side of the magnetic sensor device 8 is inserted to an inner side of the opening part 111 of the cover plate 11 and is positioned so that the medium feeding face 11a of the cover plate 11 and the sensing face 8a of the magnetic sensor device 8 are set to be the same plane as each other. Further, the first magnetizing magnet 6 is disposed on an upstream side in the first direction "X1" with respect to the magnetic sensor device 8 and the second magnetizing magnet 7 is disposed on an upstream side in the second direction "X2" with respect to the magnetic sensor device 8 and thus the magnetic sensor device 8 is positioned at a middle position between the first magnetizing magnet 6 and the second magnetizing magnet 7.

Each of a plurality of the magnetic sensor elements 13 which are held by the magnetic sensor device 8 is disposed at a middle position between the magnet piece 16 of the first magnetizing magnet 6 and the magnet piece 16 of the second magnetizing magnet 7. Therefore, the two magnet pieces 16 and the magnetic sensor element 13 disposed at the middle position between the two magnet pieces 16 are positioned so as to be juxtaposed in one row in the medium feeding direction "X".

(Magnetic Sensor Device)

The magnetic sensor device 8 detects magnetic flux in a state that a bias magnetic field is applied to a magnetized medium 2. The magnetic pattern detection device 1 collates a detected waveform from the magnetic sensor device 8 with a reference waveform to determine an authenticity of the medium 2 or to distinguish a type of the medium 2.

Figure 4:
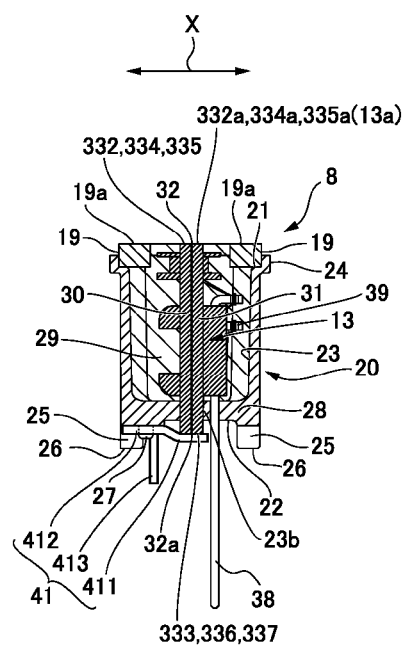
FIG. 4 is a cross-sectional view showing the magnetic sensor device.

FIGS. 3(a), 3(b) and 3(c) are a front view, a side view and a top plan view showing the magnetic sensor device 8. The front view shows the magnetic sensor device 8 viewed in the medium feeding direction "X" and the side view shows the magnetic sensor device 8 viewed in the "Y" direction which is perpendicular to the medium feeding direction "X". FIG. 4 is a cross-sectional view showing the magnetic sensor device. FIGS. 5(a), 5(b), 5(c) and 5(d) are a front view, a side view, a top plan view and a bottom view of a frame which holds the magnetic sensor element.

As shown in FIGS. 3(a), 3(b) and 3(c), the magnetic sensor device 8 includes a frame 20 and a plurality of the magnetic sensor elements 13 which are held by the frame 20 in a state that the sensing face 13a is directed to an upper side. The sensing faces 13a of the magnetic sensor elements 13 structure the sensing face 8a of the magnetic sensor device 8.

The frame 20 is formed in a rectangular thin and long prism shape as a whole. As shown in FIGS. 4 and 5(c), the frame 20 is formed with a plurality of mounting holes 23 which penetrate from an upper end face 21 of the frame 20 to its lower end face 22 with a predetermined pitch in the "Y" direction perpendicular to the medium feeding direction "X". Axial lines "L" of the respective mounting holes 23 are parallel to each other. A flange part 24 in a frame shape is provided on an outer peripheral side of the upper end face 21 of the frame 20 so as to protrude to an upper side and surround the upper end face 21. A protruded part 25 protruding downward is provided at four corners of the lower end face 22 of the frame 20 and a lower end face of each of the protruded parts 25 is formed as a grinding reference face 26 which is perpendicular to the axial line "L" of the respective mounting holes 23. Further, as shown in FIG. 5(d), a plurality of engaging projections 27 protruding downward is provided with a constant interval on a portion of the lower end face 22 of the frame 20 located on one side in the medium feeding direction "X". An upper end opening 23a of each of the mounting holes 23 which are exposed to the upper end face 21 of the frame 20 is formed in a rectangular shape as a whole. As shown in FIGS. 4 and 5(d), a partially closing part 28 which partially closes each of the mounting holes 23 is provided on an inner side of the lower end opening 23b of each of the mounting holes 23.

Figure 6C:
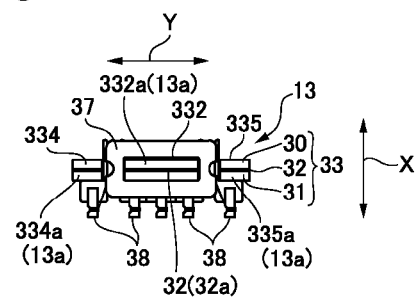
FIGS. 6(a), 6(b) and 6(c) are a front view, a side view and a top plan view showing a magnetic sensor element.
Figure 6B:
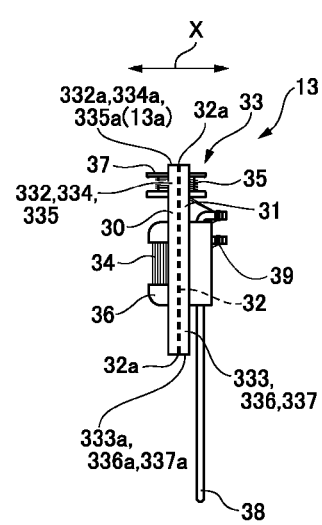
Figure 6A:
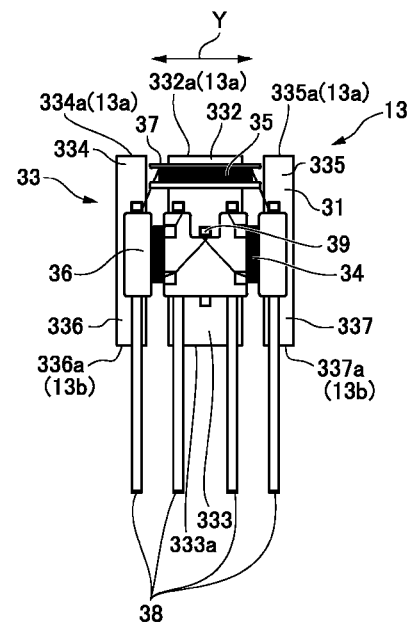
Figure 7A:
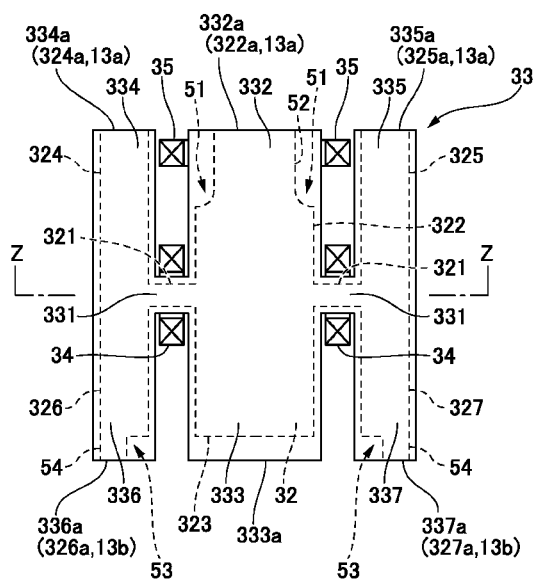
FIGS. 7(a) and 7(b) are explanatory views showing the magnetic sensor element.
Figure 7B:
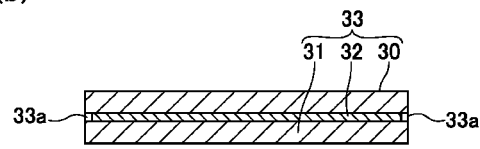
Figure 8:
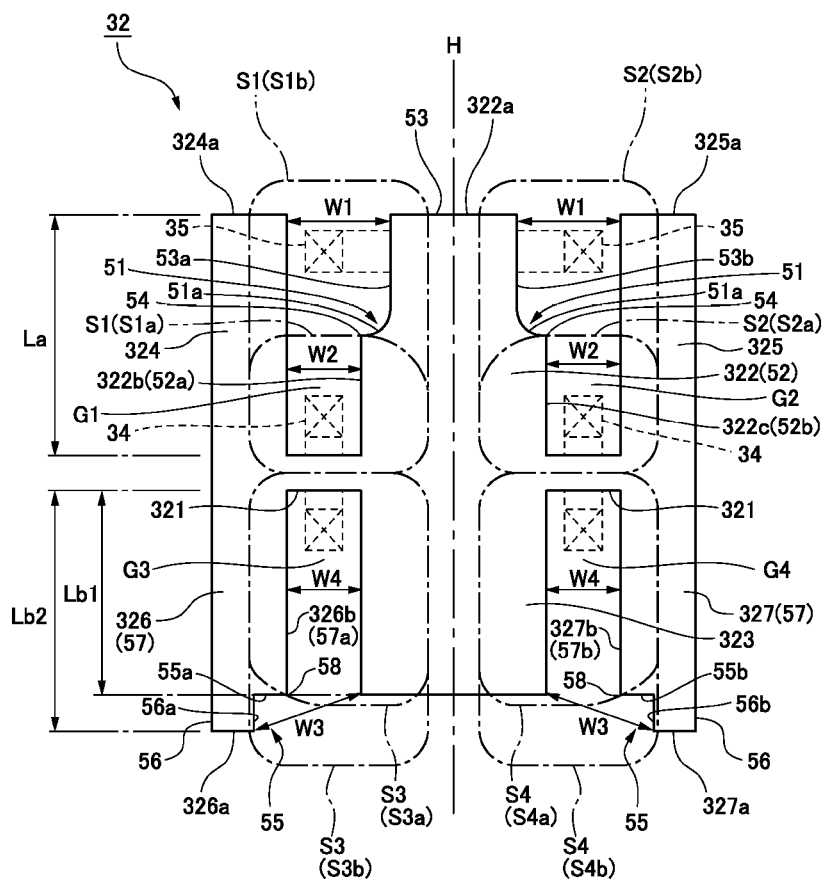
FIG. 8 is an explanatory view showing a sensor core.

FIGS. 6(a), 6(b) and 6(c) are a front view, a side view and a top plan view showing the magnetic sensor element 13. FIG. 7(a) is an explanatory view showing a core body, an exciting coil and a detection coil of the magnetic sensor element 13 and FIG. 7(b) is a cross-sectional view showing a core body ("Z-Z" cross-sectional view in FIG. 7(a)). Further, FIG. 8 is an explanatory view showing a sensor core. The magnetic sensor element 13 is, as shown in FIGS. 6(a), 6(b) and 6(c) and FIGS. 7(a) and 7(b), provided with a core body 33 having a three layer structure which is comprised of a first and a second protection plates 30 and 31 made of nonmagnetic material and a sensor core 32 sandwiched between the first and the second protection plates 30 and 31. The sensor core 32 is formed of a magnetic body such as ferrite, amorphous, permalloy, or a silicon steel plate. Further, the magnetic sensor element 13 is provided with an exciting coil 34 for generating a bias magnetic field and a detection coil 35 for detecting a magnetic pattern of a medium 2.

In this embodiment, a thin plate-shaped amorphous metal foil is used as the sensor core 32 and the amorphous metal foil formed by rolling with a roll is adhesively attached to the first and the second protection plates 30 and 31 through an adhesion layer (not shown) made of thermosetting resin or the like. The amorphous metal foil may be formed by another method such as vapor deposition. Cobalt-based or iron-based amorphous alloy may be used as the amorphous metal foil. Further, ceramics substrate such as alumina substrate, glass substrate, or resin substrate with a high degree of rigidity may be used as the first and the second protection plates 30 and 31.

As shown in FIG. 8, the sensor core 32 is provided with a body part 321 around which the exciting coil 34 is wound, an upper side center protruded part 322 which is protruded from a center portion of an upper end part of the body part 321 to an upper side where a medium 2 is passed, and a lower side center protruded part 323 which is protruded from a center portion of a lower end part of the body part 321 to a lower side. Further, the sensor core 32 is provided with a first upper side protruded part 324 and a second upper side protruded part 325, which are protruded from the upper end part of the body part 321 to an upper side on both sides of the upper side center protruded part 322, and a first lower side protruded part 326 and a second lower side protruded part 327 which are protruded from the lower end part of the body part 321 to a lower direction on both sides of the lower side center protruded part 323.

The lengths "La" of the upper side center protruded part 322, the first upper side protruded part 324 and the second upper side protruded part 325 of the sensor core 32 are set to be the same as each other. On the other hand, regarding the respective protruded parts which are protruded downward, the lengths "Lb2" of the first lower side protruded part 326 and the second lower side protruded part 327 formed on both sides of the lower side center protruded part 323 are set to be longer than the length "Lb1" of the lower side center protruded part 323.

As shown in FIG. 7(a), an external shape of the core body 33 is determined by the first and the second protection plates 30 and 31 and the core body 33 is provided with a body part 331 around which exciting coils 34 are wound, an upper side center protruded part 332 which is protruded to an upper side from a center portion of an upper end part of the body part 331, and a lower side center protruded part 333 which is protruded to a lower side from a center portion of a lower end part of the body part 331. Further, the core body 33 is provided with a first upper side protruded part 334 and a second upper side protruded part 335, which are protruded from the upper end part of the body part 331 to an upper side on both sides of the upper side center protruded part 332, and a first lower side protruded part 336 and a second lower side protruded part 337 which are protruded from the lower end part of the body part 331 to a lower side on both sides of the lower side center protruded part 333.

The core body 33 is provided with a sealing part 33a made of thermosetting resin between an outer circumferential edge of the core body 33 and an outer circumferential edge of the sensor core 32 except the upper end parts of the upper side center protruded part 332, the first upper side protruded part 334 and the second upper side protruded part 335, which are protruded upward, and the lower end parts of the first lower side protruded part 336 and the second lower side protruded part 337 which are protruded downward. In other words, the sensor core 32 is disposed on a slightly inner side region with respect to the outer circumferential edges of the first and the second protection plates 30 and 31, and the sensor core 32 is not exposed to an outer side of the core body 33 except the tip end faces 332a, 334a and 335a, which are the tip end faces of three protruded parts directed to the upper side, and the tip end faces 336a and 337a which are the tip end faces of two protruded parts directed to the lower side and disposed on both sides. An exposed portion 32a of the sensor core 32 is formed on the tip end faces 332a, 334a and 335a and the tip end faces 336a and 337a.

As shown in FIG. 8, the sensor core 32 is formed in a laterally symmetric shape with a center line "H" which passes the center in a widthwise direction as a reference. When the sensor core 32 is viewed from the front side, the upper side center protruded part 322, the first upper side protruded part 324 and the second upper side protruded part 325 are extended to the upper side in a straight shaped manner so as to be parallel to each other, and gaps "G1" and "G2" are formed between the protruded parts adjacent to each other. In these three protruded parts, the first upper side protruded part 324 and the second upper side protruded part 325 which are disposed on both ends are formed to be the same shape as each other. The first upper side protruded part 324 is formed to be the same width dimension from a connected portion with the body part 321 to the tip end face 324a. Further, similarly, the second upper side protruded part 325 is also formed to be the same width dimension from a connected portion with the body part 321 to the tip end face 325a.

The upper side center protruded part 322 is provided with stepped parts 51 on both side faces 322b and 322c in the widthwise direction which respectively face the first upper side protruded part 324 and the second upper side protruded part 325 that are the adjacent protruded parts. The stepped part 51 is formed in a shape that a side end part of the tip end part of the upper side center protruded part 322 is cut off. The tip end portion of the upper side center protruded part 322 which is extended to the tip end side from the stepped parts 51 is formed to be a constricted part 53 whose width (dimension in a direction perpendicular to the protruding direction from the body part 321) is thinner than a root portion 52 on a side of the body part 321 with respect to the stepped part 51.

Side faces 322b and 322c of the upper side center protruded part 322 are provided with lower side face portions 52a and 52b which are both side faces in the widthwise direction of the root portion 52, stepped face portions 51a and 51b which are extended toward an upper side from the upper ends of the lower side face portions 52a and 52b while being curved to inner sides in the widthwise direction of the upper side center protruded part 322, and side face tip end portions 53a and 53b which are extended to the upper side in a straight line shape from the upper ends of the stepped face portions 51a and 51b to both upper end positions of the tip end face 322a. The side face tip end portions 53a and 53b are both side faces in the widthwise direction of the constricted part 53 and are located at positions retreated to inner sides in the widthwise direction of the upper side center protruded part 322 with respect to the lower side face portions 52a and 52b. The constricted part 53 is provided with the same width dimension from the connected parts with the stepped face portions 51a and 51b to the tip end face 322a. The stepped face portions 51a and 51b are formed in a ¼ circular arc shape and are directed to the tip end side of the protruded part. A connected portion of each of the upper ends of the lower side face portions 52a and 52b with each of the end parts of the stepped face portions 51a and 51b is formed to be an edge part 54 formed in a projecting corner shape. The root portion 52 of the upper side center protruded part 322 is provided with the same width dimension from the connected part with the body part 321 to the edge part 54.

In the upper part of the sensor core 32, a width of a gap "G1" formed between the first upper side protruded part 324 and the upper side center protruded part 322 and a width of a gap "G2" formed between the second upper side protruded part 325 and the upper side center protruded part 322 are varied with the position of the stepped part 51 as a boundary. In other words, the widths "W1" of the gaps "G1" and "G2" corresponding to the constricted part 53 (position on the tip end side with respect to the stepped part 51) are wider than the widths "W2" of the gaps "G1" and "G2" corresponding to the root portion 52 (position on the body part 321 side with respect to the stepped part). The widths of the gaps "G1" and "G2" are varied from "W1" to "W2" at the positions of the stepped face portions 51a and 51b.

The lower side center protruded part 323, the first lower side protruded part 326 and the second lower side protruded part 327 of the sensor core 32 are extended toward a lower side in a straight shape so as to be parallel to each other. Gaps "G3" and "G4" are formed between the protruded parts adjacent to each other. The lower side center protruded part 323 disposed at a center position is disposed so that the center line "H" is passed through its center in the widthwise direction and is provided with the same width dimension from the connected portion with the body part 321 to the tip end face 323a. A width dimension of the lower side center protruded part 323 is the same as the width dimension of the root portion 52 of the upper side center protruded part 322.

In the first lower side protruded part 326 and the second lower side protruded part 327, a stepped part 55 is formed at each of tip ends of a side face 326b and a side face 327b which face the lower side center protruded part 323 that is the adjacent protruded part. The stepped part 55 is formed in a shape that the side face 326b and the side face 327b are cut off in a stepped shape. The first lower side protruded part 326 and the second lower side protruded part 327 are provided with a tip end part 56, which is extended to the tip end side from the stepped part 55, and a root portion 57 formed on the body part 321 side with respect to the stepped part 55. A width of the tip end part 56 is set to be thinner than that of the root portion 57.

The side face 326b of the first lower side protruded part 326 is provided with an upper side face portion 57a which is extended downward in a straight line shape from the lower end of the body part 321, a stepped face portion 55a which is horizontally extended from a lower end of the upper side face portion 57a to an inner side in the widthwise direction of the first lower side protruded part 326, and a side face tip end portion 56a which is extended downward in a straight line shape from an end part of the stepped face portion 55a. Further, similarly, the side face 327b of the second lower side protruded part 327 is provided with an upper side face portion 57b which is extended downward in a straight line shape from the lower end of the body part 321, a stepped face portion 55b which is horizontally extended from a lower end of the upper side face portion 57b to an inner side in the widthwise direction of the second lower side protruded part 327, and a side face tip end portion 56b which is extended downward in a straight line shape from an end part of the stepped face portion 55b. The side face tip end portions 56a and 56b are provided at positions which are retreated to the inner sides in the widthwise direction of the first lower side protruded part 326 and the second lower side protruded part 327 with respect to the upper side face portions 57a and 57b. The stepped face portions 55a and 55b are directed to the tip end sides of the protruded parts. A connected portion of each of lower ends of the upper side face portions 57a and 57b with each of end parts of the stepped face portions 55a and 55b is formed to be an edge part 58 formed in a projecting corner shape.

The root portions 57 of the first lower side protruded part 326 and the second lower side protruded part 327 are provided with the same width dimension from connected portions with the body part 321 to the positions of the stepped face portions 55a and 55b. The root portion 57 is formed so that its width dimension is the same as those of the first upper side protruded part 324 and the second upper side protruded part 325. Further, the tip end parts 56 of the first lower side protruded part 326 and the second lower side protruded part 327 are provided with the same width dimension from the positions of the stepped face portions 55a and 55b to the tip end faces 326a and 327a.

In the lower part of the sensor core 32, a width of a gap "G3" between the first lower side protruded part 326 and the lower side center protruded part 323 and a width of a gap "G4" between the second lower side protruded part 327 and the lower side center protruded part 323 are varied from a position where the stepped part 55 is provided as a boundary. In other words, the widths "W3" of the gaps "G3" and "G4" corresponding to the tip end parts 56 (position on the tip end side with respect to the stepped part 55) are wider than the widths "W4" of the gaps "G3" and "G4" corresponding to the root portion 57 (position on the body part 321 side with respect to the stepped part 55). In this embodiment, as shown in FIG. 8, a length of the lower side center protruded part 323 is short and the lower side center protruded part 323 is not extended to a position directly facing the tip end parts 56 and thus the distances from the tip end parts 56 to the tip end of the lower side center protruded part 323 are defined as the widths "W3" of the gaps corresponding to the tip end part 56.

Respective tip end faces 332a, 334a and 335a of the upper side center protruded part 332, the first upper side protruded part 334 and the second upper side protruded part 335 which are protruded to a side of a medium 2 are a worked face which is formed by grinding work or cutting work. The respective tip end faces 322a, 324a and 325a of the upper side center protruded part 322, the first upper side protruded part 324 and the second upper side protruded part 325 of the sensor core 32, i.e., the worked faces are exposed to form exposed portions 32a of the sensor core 32. Further, respective tip end faces 336a and 337a of the first lower side protruded part 336 and the second lower side protruded part 337 which are protruded to the opposite side to a medium 2 are similarly formed as a worked face which is formed by grinding work or cutting work. The respective tip end faces 326a and 327a, i.e., the worked faces, of the first lower side protruded part 326 and the second lower side protruded part 327 of the sensor core 32 are exposed. The tip end faces 322a, 324a and 325a and the tip end faces 326a and 327a are a cutting worked face or a grinding worked face which is formed by performing a cutting work or a grinding work on an amorphous metal film, which is a sensor core substrate, together with the first and the second protection plates 30 and 31.

The tip end faces 332a, 334a and 335a of the upper side center protruded part 332, the first upper side protruded part 334 and the second upper side protruded part 335 are located on the same plane and the tip end faces 332a, 334a and 335a structure the sensing face 13a of the magnetic sensor element 13. The upper side center protruded part 332, the first upper side protruded part 334 and the second upper side protruded part 335 are worked in lengths so that a distance between the tip end faces 332a, 334a and 335a (sensing face 13a) and a medium 2 is set to be a previously set dimension.

Further, the first lower side protruded part 336 and the second lower side protruded part 337 are cut off or ground in a length that the sensor core 32 is exposed and the tip end faces 336a and 337a of the first lower side protruded part 336 and the second lower side protruded part 337 are formed to be a grounding face 13b of the magnetic sensor element 13 for electrically grounding the sensor core 32 through the exposed portion 32a. In this embodiment, the lower side center protruded part 323 is formed shorter than the protruded parts disposed on its both sides and the sensor core 32 is not exposed at the position of the tip end face 333a of the lower side center protruded part 333.

In order to manufacture the core body 33 having a structure as described above, a magnetic body layer is formed so as to be bonded to one of the first and the second protection plates 30 and 31 through an adhesion layer and then, the other of the first and the second protection plates 30 and 31 are bonded through an adhesion layer so that the magnetic body layer is sandwiched therebetween. In this case, in order to efficiently manufacture a large number of the core bodies 33, a following manufacturing method may be used. In other words, a large substrate is used as the first and the second protection plates 30 and 31 and, after an adhesive sheet made of thermosetting resin is placed on a surface of one of the substrates, an amorphous metal foil is superposed on the surface of the adhesive sheet. Next, heat and pressure are applied in this state to cure the adhesive sheet and the substrate and the amorphous metal foil are bonded by thermo compression bonding. Next, an etching mask is formed in a region which is to be left as the sensor core 32 and, after the amorphous metal foil is etched through an opening part of the etching mask, the etching mask is removed and thereby the magnetic body layer is patterned in a shape of the sensor core 32. Next, the other substrate is adhesively bonded and then the product is cut off in a core shape which is one piece of the core body 33.

As shown in FIGS. 6(a), 6(b) and 6(c), the exciting coil 34 of the magnetic sensor element 13 is structured by winding a coil wire through a first coil bobbin 36 on both sides of the upper side center protruded part 332 and the lower side center protruded part 333 in the body part 331 of the core body 33, and on inner sides of the first upper side protruded part 334 and the second upper side protruded part 335 and on inner sides of the first lower side protruded part 336 and the second lower side protruded part 337. On the other hand, the detection coil 35 is structured by winding a coil wire at the tip end portion of the upper side center protruded part 332 through the second coil bobbin 37. As shown in FIG. 7(a), the detection coil 35 is wound around a portion of the constricted part 53 of the sensor core 32.

As shown by the alternate long and short dash line in FIG. 8, the bias magnetic field which is formed by the exciting coils 34 is structured of magnetic flux passing through open magnetic paths S1 through S4 which are structured of the body part 321 and the respective protruded parts 322 through 327 of the sensor core 32. In other words, the upper part of the sensor core 32 structures an open magnetic path "S1" passing through a U-shaped magnetic body portion, which is comprised of the upper side center protruded part 322, the first upper side protruded part 324 and the body part 321, and an open magnetic path "S2" passing through a U-shaped magnetic body portion comprised of the upper side center protruded part 322, the second upper side protruded part 325 and the body part 321. Further, the lower part of the sensor core 32 structures an open magnetic path "S3" passing through a U-shaped magnetic body portion, which is comprised of the lower side center protruded part 323, the first lower side protruded part 326 and the body part 321, and an open magnetic path "S4" passing through a U-shaped magnetic body portion comprised of the lower side center protruded part 323, the second lower side protruded part 325 and the body part 321.

In this embodiment, the stepped part 51 is formed on the side faces 322b and 322c of the upper side center protruded part 322 which structures the open magnetic paths "S1" and "S2". Therefore, the widths of the gaps "G1" and "G2" between protruded parts adjacent to each other are increased to the dimension "W1" from the dimension "W2" with the stepped part 51 as a boundary. Further, the portions of the side faces 322b and 322c where the stepped parts 51 are formed are formed with the edge parts 54 formed in a projecting corner shape. Therefore, in the open magnetic paths "S1" and "S2", magnetic flux leaked out from the edge parts 54 and the portion on the body part 321 side with respect to the edge parts 54 is increased in comparison with a case that the stepped parts 51 are not formed. In other words, much magnetic flux passes through the paths "S1a" and "S2a" which are short-cut from the edge parts 54 and the portion on the body part 321 side with respect to the edge parts 54 to the first upper side protruded part 324 and the second upper side protruded part 325 and thus, the ratio of the magnetic flux passing through the paths "S1b" and "S2b" which pass from the tip end of the upper side center protruded part 322 to the tip ends of the first upper side protruded part 324 and the second upper side protruded part 325 is decreased.

Further, the stepped parts 55 are formed on the side faces 326b and 327b of the first lower side protruded part 326 and the second lower side protruded part 327 which structure the open magnetic paths "S3" and "S4" and the widths of the gaps "G3" and "G4" between the protruded parts adjacent to each other are increased to the dimension "W3" from the dimension "W4" with the stepped part 55 as a boundary. Further, the edge part 58 in a projecting corner shape is formed on the portions of the side faces 326b and 327b where the stepped part 51 is formed. Therefore, also in the open magnetic paths "S3" and "S4", magnetic flux leaked out from the edge part 58 and the portion on the body part 321 side with respect to the edge parts 58 is increased in comparison with a case that the stepped parts 55 are not formed. In other words, much magnetic flux passes through the paths "S3a" and "S4a" which are short-cut from the edge parts 58 and the portion on the body part 321 side with respect to the edge parts 58 to the lower side center protruded part 323 and thus, the ratio of the magnetic flux passing through the paths "S3b" and "S4b" which pass from the tip end of the first lower side protruded part 326 and the tip end of the second lower side protruded part 327 to the tip end of the lower side center protruded part 323 is decreased.

In this embodiment, as shown in FIGS. 6(a), 6(b) and 6(c), four terminal pins 38 extending downward are attached to a portion of the first coil bobbin 36 which is located on a side of the second protection plate 31. Respective terminal pins 38 are protruded from the upper end of the first coil bobbin 36 and a coil wire of the exciting coil 34 or a coil wire of the detection coil 35 is connected with the tip ends of the terminal pins 38. Further, a connecting pin 39 whose dimension is shorter than the terminal pin 38 is attached at a center position of the four terminal pins 38. The coil wire of the exciting coil 34 is connected with the upper end of the connecting pin 39.

As shown in FIG. 4, each of the magnetic sensor elements 13 is inserted into each of the mounting holes 23 from an upper side in a state that the sensing face 13a is directed upward. Each of the magnetic sensor elements 13 is disposed in a state that the thickness direction of the core body 33 is set in the medium feeding direction "X". In the state that each of the magnetic sensor elements 13 is inserted into the mounting hole 23, the partially closing part 28 is inserted between the lower side center protruded part 333, the first lower side protruded part 336 and the second lower side protruded part 337 of the core body 33 and thus, the lower side center protruded part 333, the first lower side protruded part 336, the second lower side protruded part 337 and the four terminal pins 38 are protruded from the lower end opening 23b of the mounting hole 23. Further, the upper side center protruded part 332, the first upper side protruded part 334 and the second upper side protruded part 335 are protruded from the upper end opening 23a of the mounting hole 23.

As shown in FIGS. 3(a), 3(b) and 3(c) and FIG. 4, two rectangular wear resistant plates 19 are inserted on an inner side of the flange part 24 of the frame 20. The two pieces of the wear resistant plate 19 are placed on the upper end face 21 of the frame 20 in a state that a predetermined space is secured in the medium feeding direction "X". Each of the wear resistant plate 19 is a member having a constant thickness which is made of ceramics or the like and is extended with a constant width in a direction perpendicular to the medium feeding direction "X". An upper end face 19a of each of the wear resistant plates 19 is protruded upward with respect to the upper end face of the flange part 24. Upper end portions of the upper side center protruded part 332, the first upper side protruded part 334 and the second upper side protruded part 335 of the core body 33 of the magnetic sensor element 13 are inserted in a space between two pieces of the wear resistant plate 19. The respective tip end faces 332a, 334a and 335a (sensing face 13a) of the upper side center protruded part 332, the first upper side protruded part 334 and the second upper side protruded part 335 are located on the same plane as the upper end faces 19a of the respective wear resistant plates 19. Resin 29 is filled in the each of the mounting holes 23 and the two pieces of the wear resistant plate 19 and the respective magnetic sensor elements 13 are fixed to the frame 20 by the resin 29.

Figure 9A:
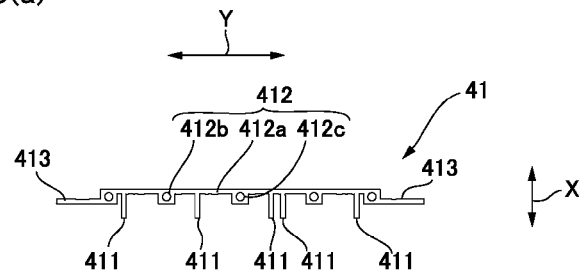
FIGS. 9(a), 9(b), 9(c) and 9(d) are explanatory views showing an electrical conduction member.
Figure 9B:
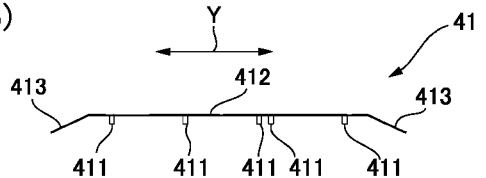
Figure 9C:
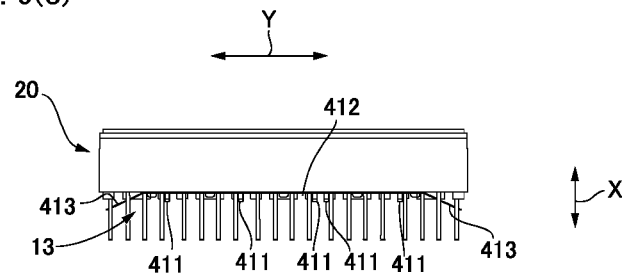

As shown in FIGS. 3(a) and 3(b), an electrical conduction member 41 for grounding the sensor core 32 of the magnetic sensor element 13 is attached to a lower end portion of the frame 20. FIG. 9(a) is a plan view showing the electrical conduction member 41 and FIG. 9(b) is a front view showing the electrical conduction member 41 when viewed in the medium feeding direction "X" in a state that the electrical conduction member 41 is attached to the frame 20. FIG. 9(c) is an explanatory view schematically showing the magnetic sensor device 8 in which the electrical conduction member 41 is attached to the lower end face 22 of the frame 20 when viewed in the medium feeding direction "X" and FIG. 9(d) is an explanatory bottom view schematically showing a state that the electrical conduction member 41 is attached to the lower end face 22 of the frame 20.

The electrical conduction member 41 is a plate spring which is formed by etching a metal thin plate. In accordance with an embodiment of the present invention, an electrical conduction member 41 made of resin or the like having electrically conductive property may be used. As shown in FIG. 4, the electrical conduction member 41 is provided with a plurality of extended parts 411 which are extended from the lower end side of the frame 20 to the lower end portions of the core bodies 33 of the magnetic sensor elements 13 and are pressed against the respective sensor cores 32, a mounting part 412 which is fixed to the lower end face 22 of the frame 20, and contacting parts 413 which are provided at both end portions of the mounting part 412 in the "Y" direction perpendicular to the medium feeding direction "X" and are bent in a direction separated from the lower end face 22 of the frame 20.

Figure 9D:
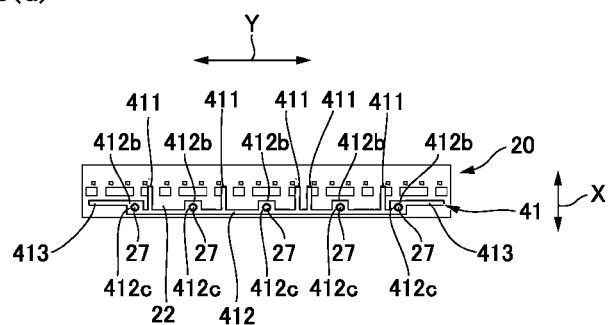

The mounting part 412 is, as shown in FIGS. 9(a) and 9(d), provided with a constant width portion 412a, which is extended in the direction "Y" perpendicular to the medium feeding direction "X" to connect end portions of the respective extended parts 411 with each other on the side of the frame 20, width wide portions 412b having a wider width than the constant width portion 412a which are provided at plural positions in the middle of the constant width portion 412a. Each of the width wide portions 412b is formed with an engagement hole 412c which is capable of engaging with an engaging projection 27 of the frame 20. The electrical conduction member 41 is, as shown in FIG. 9(d), attached to the lower end face portion 22a of the frame 20 by engaging the engaging projection 27 with the engagement hole 412c and melting the engaging projection 27 by heat and being crushed and thereby the engagement hole 412c is closed.

When the mounting part 412 of the electrical conduction member 41 is fixed to the lower end face of the frame 20 and thereby each of the extended parts 411 is extended from the frame 20 to the lower end portion of the core body 33, the tip end portion 411a of each of the extended parts 411 is elastically deformed downward. As a result, the tip end portion 411a of each of the extended parts 411 is pressed against the exposed portion 32a of the sensor core 32, which is the exposed tip end portion of the first lower side protruded part 336 or the exposed tip end portion of the second lower side protruded part 337 of the core body 33 by an elastic returning force of the extended part 411. In this manner, the sensor cores 32 of a plurality of the magnetic sensor elements 13 and the electrical conduction member 41 are electrically connected with each other.

In this embodiment, the magnetic sensor device 8 is, as shown in FIGS. 2(a) and 2(b), held by the case 10 on which the first magnetizing magnet 6 and the second magnetizing magnet 7 are mounted to structure the magnetic sensor unit 5. FIG. 10(a) is an explanatory view showing a state that the magnetic sensor device 8 is held by the case 10 and FIG. 10(b) is a cross-sectional view showing a state that the magnetic sensor device 8 is held by the case 10. As shown in FIG. 10(b), the case 10 is provided with a groove 104 into which the magnetic sensor device 8 is capable of being inserted. When the magnetic sensor device 8 is inserted into the groove 104 from an upper side, the contacting parts 413 of the electrical conduction member 41 which is fixed to the lower end face of the frame 20 is abutted with an inner peripheral face 104a of the groove 104. The case 10 is grounded through the frame of the magnetic pattern detection device 1 and thus the sensor core 32 of the magnetic sensor element 13 is grounded through the case 10 and the electrical conduction member 41.

(Manufacturing Method for Magnetic Sensor Device)

Next, a manufacturing method for the magnetic sensor device 8 will be described with reference to FIGS. 3(a), 3(b) and 3(c) and FIGS. 11(a) and 11(b). FIG. 11(a) is a front view showing the magnetic sensor device 8 whose upper end face is not ground yet and FIG. 11(b) is its side view.

In order to manufacture the magnetic sensor device 8, first, the respective magnetic sensor elements 13 are inserted into the respective mounting holes 23 of the frame 20. As a result, the respective magnetic sensor elements 13 are abutted with the inner peripheral face portions 23c of the respective mounting holes 23 and thus, positioning in the direction which is perpendicular to the axial line "L" direction of the mounting hole 23 is performed. In other words, positioning in the medium feeding direction "X" and positioning in the "Y" direction perpendicular to the medium feeding direction "X" are performed. As a result, the positions of the respective magnetic sensor elements 13 are mutually determined accurately.

Next, a plurality of the magnetic sensor elements 13 inserted into the mounting holes 23 is supported by a jig (not shown) from a lower side and the respective magnetic sensor elements 13 are positioned in the direction of the axial line "L" of each of the mounting holes 23 with the grinding reference faces 26 provided on the lower end of the frame 20 as a reference. As a result, the upper end portions of the upper side center protruded part 332, the first upper side protruded part 334 and the second upper side protruded part 335 of the core body 33 are set to be in a protruded state upward from the upper end openings 23a of the respective mounting holes 23, in other words, from the upper end face 21 of the frame 20 by an amount more than the thickness dimension of the wear resistant plate 19.

After that, two pieces of the rectangular wear resistant plate 19 are inserted into inner sides of the flange parts 24 of the frame 20 in a state that a predetermined space is secured in the medium feeding direction "X" and are placed on the upper end face 21 of the frame 20. Next, resin 29 is filled into the respective mounting holes 23 through space between two pieces of the wear resistant plate 19 and, in this manner, the respective magnetic sensor elements 13 and the respective wear resistant plates 19 are fixed to the frame 20. In this case, as shown in FIG. 11(b), the resin 29 is filled so as to be protruded upward with respect to the flange part 24 of the frame 20.

Next, the tip end face 332a of the upper side center protruded part 332, the tip end face 334a of the first upper side protruded part 334 and the tip end face 335a of the second upper side protruded part 335 of the core body 33, the upper end faces 19a of the two pieces of the wear resistant plate 19 and the resin 29 protruded between the two pieces of the wear resistant plate 19 are surface-ground to the reference face "B" which is set previously with the grinding reference face 26 of the frame 20 as a reference. The tip end face 332a of the upper side center protruded part 332, the tip end face 334a of the first upper side protruded part 334, the tip end face 335a of the second upper side protruded part 335 of the core body 33 (sensing face 13a), the upper end faces 19a of the two pieces of the wear resistant plate 19 and the upper face of the resin 29 are positioned on the same plane by the surface-grinding.

Next, the electrical conduction member 41 is attached to the lower end face 22 of the frame 20 so that the extended parts 411 of the electrical conduction member 41 are abutted with the exposed portions 32a of the sensor core 32. The tip end portions of the lower side center protruded part 333, the first lower side protruded part 336 and the second lower side protruded part 337 of the core body 33 are previously performed with a cutting work or a grinding work so that the exposed portion 32a of the sensor core 32 is formed on the tip ends of the first lower side protruded part 336 and the second lower side protruded part 337.

After that, the magnetic sensor device 8 is inserted into the inner side of the groove 104 of the case 10 and the contacting parts 413 of the electrical conduction member 41 and the inner peripheral face 104a of the groove 104 are contacted with each other. After that, the sensor core 32 of the magnetic sensor element 13 is grounded by mounting the case 10.

(Magnetic Pattern Detecting Operation of Magnetic Pattern Detection Device)

Figures 12A, 12B:
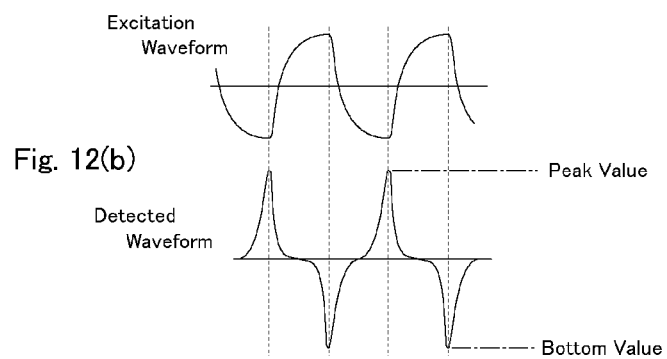
FIGS. 12(a) and 12(b) are views showing an excitation waveform and a detected waveform of the magnetic sensor element.
Figure 13A:
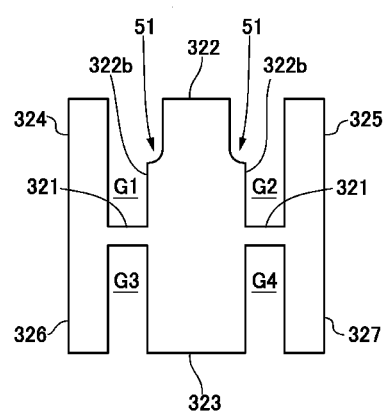
FIGS. 13(a), 13b), 13(c) and 13(d) are explanatory views showing a sensor core in accordance with other embodiments of the present invention.
Figure 13B:
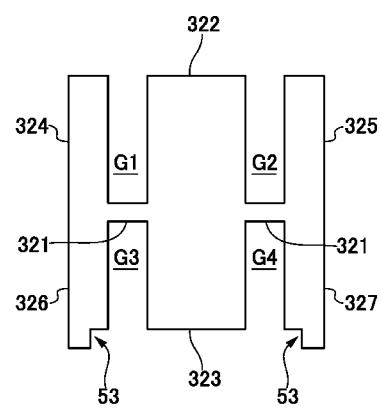
Figure 13C:
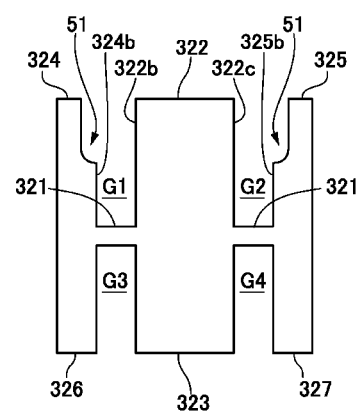
Figure 13D:
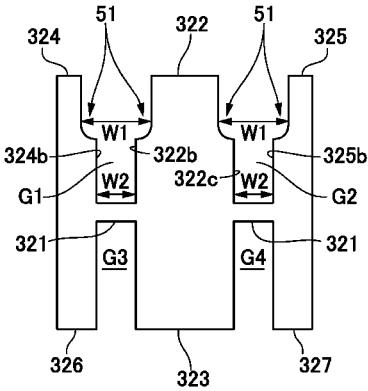

Next, a magnetic pattern detecting operation of the magnetic pattern detection device 1 will be described with reference to FIG. 1 and FIGS. 12(a) and 12(b). FIG. 12(a) is an excitation waveform to the magnetic sensor element 13 and FIG. 12(b) is a detected waveform from the magnetic sensor element 13. As shown in FIG. 1, in the magnetic pattern detection device 1, when a medium 2 is carried on the medium feeding path 3 in the first direction "X1" or the second direction "X2", the medium 2 is magnetized by the first magnetizing magnet 6 or the second magnetizing magnet 7 before the medium 2 is reached to the magnetism reading position "A". After that, the magnetized medium 2 is passed through the magnetism reading position "A" of the magnetic sensor device 8.

In the magnetic sensor device 8, as shown in FIG. 12(a), an alternating current is applied to the exciting coil 34 with a constant current and bias magnetic fields as shown by the alternate long and short dash line in FIG. 8 are formed around the core body 33. When the medium 2 is passed through the magnetism reading position "A", a signal having a detected waveform shown in FIG. 12(b) is outputted from the detection coil 35. The detected waveform is a differential signal to the bias magnetic field and the time.

A shape of the detected waveform from the magnetic sensor element 13 and its peak value and its bottom value are varied according to the types of the magnetic ink used for forming the magnetic pattern, the position of the magnetic pattern, and the concentration difference of the formed magnetic pattern. Therefore, the detected waveform is collated with previously memorized reference waveforms to perform authenticity determination of the medium 2 and discrimination of the type of the medium 2.

(Operations and Effects)

According to the sensor core shape in this embodiment, the bias magnetic field by the exciting coil 34 is formed so that the magnetic flux which is short-cut at the portion near the body part 321 of the sensor core 32 is increased in comparison with a case that a conventional shape of the sensor core is adopted in which the above-mentioned stepped parts 51 and 55 are not provided and are provided with the same width from the root part to the tip end. As a result, in this embodiment, the magnetic flux density in the portion which is near to the body part 321 is high and the magnetic flux density in the portion apart from the body part 321 is low.

The shape of the sensor core in this embodiment as described above in which the magnetic flux density in the portion apart from the body part 321 is low is a shape in which the tip end portion of the sensor core 32 apart from the body part 321 has less contribution to the magnetic circuit. In this embodiment, the sensing face 13a of the sensor core 32 is coincided with the reference face "B" which is set with the grinding reference face 26 of the frame 20 as a reference to accurately set a distance between the sensing face 13a and a medium 2. Therefore, the respective tip ends of the upper side center protruded part 332, the first upper side protruded part 334 and the second upper side protruded part 335 are cut off or ground so as to be the same plane as the reference face "B". In this case, a dimension by working may vary due to variation in working and the like and, as a result, the length "La" of each of the protruded parts may be varied. However, even when the dimension "La" is varied due to variation in working, the dimension is varied in the range of the constricted part 53 which is located in a region where the magnetic flux density is low. Therefore, influence exerted on the magnetic circuit is small.

Further, when the tip ends of the first lower side protruded part 336 and the second lower side protruded part 337 are cut off or ground for forming the exposed portion 32*a* for grounding in the sensor core 32, variation may occur in their working dimensions. However, also in this case, variation of the cutting positions of the first lower side protruded part 336 and the second lower side protruded part 337 due to variation in working may be varied in the range of the tip end parts 56 whose width is narrowed by forming the stepped part 55 and thus the variation may occur in the region where the magnetic flux density is low. Therefore, influence exerted on the magnetic circuit due to variations in working of the first lower side protruded part 326 and the second lower side protruded part 327 is small.

As described above, in this embodiment, influence exerted on the magnetic circuit due to variation in working of the sensor core 32 and the core body 33 into which the sensor core 32 is incorporated is small and thus variation of the sensor sensitivity, current efficiency and the like due to variation in working is small. The magnetic sensor element 13 in this embodiment adopts the above-mentioned shape of the sensor core and thus, while a high degree of sensitivity is obtained, the characteristic variation of the magnetic sensor element 13 due to variation in working of the sensor core 32 and the core body 33 to which the sensor core 32 is incorporated is reduced.

Further, in this embodiment, in the end part on the grounding side of the sensor core 32, the length "Lb1" of the lower side center protruded part 323 is set to be short and the lengths "Lb2" of the first lower side protruded part 326 and the second lower side protruded part 327 where the exposed portion 32*a* of the sensor core 32 is formed are set to be longer. According to this structure, even when the working for forming the grounding face 13*b* is performed, the length "Lb1" of the lower side center protruded part 323 is not varied and thus influence exerted on the magnetic circuit due to variation in working of the sensor core 32 is further reduced.

In addition, in this embodiment, in the end part on a medium 2 side of the sensor core 32, the stepped part 51 is formed on both side faces in the widthwise direction of the upper side center protruded part 322 that is the center protruded part of the three protruded parts and the first upper side protruded part 324 and the second upper side protruded part 325 are symmetrically formed so as to interpose the upper side center protruded part 322 therebetween. The upper side center protruded part 322 structures both of the open magnetic paths "S1" and "S2" and thus, the magnetic flux passing through both of the magnetic paths is influenced by the upper side center protruded part 322 and its influence for the magnetic circuit is large. According to this embodiment, the stepped part 51 is formed on the upper side center protruded part 322 so that its width is set to be thinner and thus the magnetic flux passing through the tip end is reduced effectively and much magnetic flux is concentrated on the portion near the body part 321. Therefore, influence on the magnetic circuit due to variation in working of the tip end of the upper side center protruded part 322 is further reduced. In addition, the magnetic flux distribution in the widthwise direction (right and left direction in FIG. 8) of the sensor core 32 is symmetric and thus the magnetic flux is concentrated on the side of the body part 321 without changing the symmetric property. Therefore, the characteristic variation of the magnetic sensor element 13 is further reduced.

Further, in this embodiment, the magnetic flux is concentrated on the vicinity of the exciting coil 34 and thus useless magnetic field having no relation for sensing is not applied to the detection coil 35 which is structured at the tip end on a medium 2 side of the sensor core 32. Therefore, a further high degree of sensitivity can be obtained. Further, the magnetic circuit having a small magnetic resistance is structured by short-cutting the magnetic flux in the vicinity of the exciting coil 34 and thus the current efficiency is improved. Accordingly, downsizing and power-saving of the magnetic sensor device 8 are attained.

(Other Embodiments)

In the embodiment described above, the stepped parts 51 and 55 are provided in both of the protruded part of the sensor core 32 (upper side center protruded part 322), which is extended to a medium 2 side, and the protruded parts (first lower side protruded part 326 and second lower side protruded part 327) which are extended to a side opposite to the medium 2 to concentrate the magnetic flux on the body part 321 side with respect to both ends of the sensor core 32. However, as shown in FIG. 13(*a*), it may be structured that only the protruded part (upper side center protruded part 322) extended to a medium 2 side is formed with the stepped part 51. Alternatively, as shown in FIG. 13(*b*), only the protruded parts (first lower side protruded part 326 and second lower side protruded part 327) extended to the side opposite to a medium 2 may be formed with the stepped part 55.

In the embodiment described above, the both side faces 322*b* and 322*c* in the widthwise direction of the protruded part (upper side center protruded part 322) disposed at the center of the protruded parts extended to a medium 2 side of the sensor core 32 are formed with the stepped part 51. However, as shown in FIG. 13(*c*), the side face 324*b* of the first upper side protruded part 324 or the side face 325*b* of the second upper side protruded part 325 which face the side faces 322*b* and 322*c* may be formed with the stepped part 51. Also in this structure, the width of the gap "G1" formed between the upper side center protruded part 322 and the first upper side protruded part 324 and the width of the gap "G2" formed between the second upper side protruded part 325 and the upper side center protruded part 322 are set to be wide on their tip end sides and narrow on their root part sides and thus the magnetic flux is short-cut in the portion near the body part 321.

In this case, it is further preferable that, as shown in FIG. 13(*d*), the stepped part 51 is formed on both of two side faces which face through the gaps "G1" and "G2" (in other words, the side face 322*b* and the side face 324*b*, or the side face 322*c* and the side face 325*b*). According to this structure, in comparison with a case that the stepped part 51 is formed on only one side face, a difference of dimensions between the width "W1" on the tip end side and the width "W2" on the root part side in the gaps "G1" and "G2" is further large. Therefore, the ratio of the magnetic flux which is short-cut in the portion near the body part 321 is further increased. Further, similarly, also in the protruded parts of the sensor core 32 which are extended to the side opposite to a medium 2, the position forming the stepped part 55 may be changed appropriately.

Figure 14A:
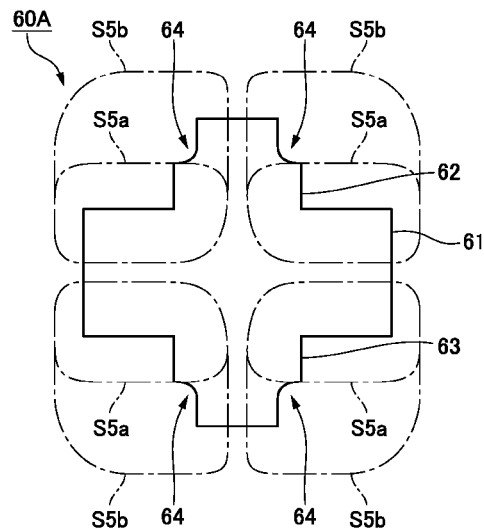
FIGS. 14(a) and 14(b) are explanatory views showing a sensor core in accordance with other embodiments of the present invention.

The sensor core 32 in the embodiment described above is respectively provided with three protruded parts on a medium 2 side and its opposite side. However, an embodiment of the present invention may be applied a sensor core whose number of the protruded parts is two or less, or four or more. The shapes of the sensor core whose number of the protruded part is different are shown in FIGS. 14(*a*) and 14(*b*). The sensor core 60A in FIG. 14(a) is provided with a body part 61 and protruded parts 62 and 63 which are protruded from the body part 61 one piece each in the upper and lower direction and a stepped part 64 is formed on both side faces in the widthwise direction of the protruded parts 62 and 63. In this case, a path "S5a" where magnetic flux which is leaked out from the stepped part 64 to an outer side of the sensor core is returned to the sensor core 60A is shorter than a path "S5b" where magnetic flux which is leaked out from the tip ends of the protruded parts 62 and 63 to outer sides of the sensor core is returned to the sensor core 60A. Therefore, the ratio of the magnetic flux passing through the path "S5a" which is short-cut by the stepped part 64 is increased.

Figure 14B:
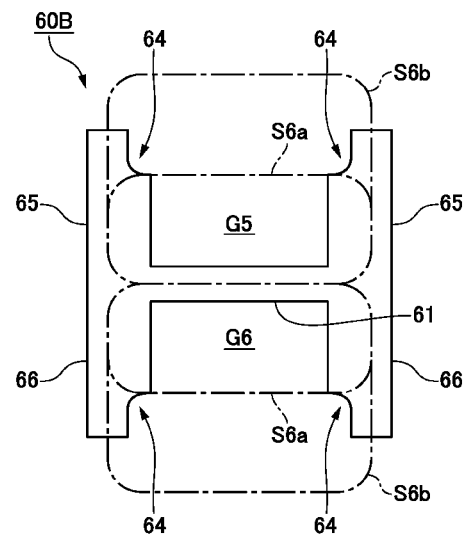

Further, the sensor core 60B in FIG. 14(b) is provided with two protruded parts 65 which are protruded in the upper direction from the body part 61 and two protruded parts 66 which are protruded in the lower direction and the stepped part 64 is formed on each of side faces of the protruded parts 65 and 66 facing each other. According to this shape, the widths of the gap "G5" and "G6" between the two protruded parts 65 and 66 are set to be wide on their tip end sides with respect to the stepped part 64 and narrow on their root part sides. As a result, the ratio of magnetic flux passing through the path "S6a" which is short-cut by the stepped part 64 is large and the ratio of magnetic flux passing through the path "S6b" which passes from a tip end of the protruded part to a tip end of the adjacent protruded part is small. In a case that the sensor core is provided with two or more protruded parts, the ratio of magnetic flux passing through the tip end of the protruded part is reduced by applying the structure shown in FIG. 14(b) to the adjacent protruded parts.

Both of the core shapes shown in FIGS. 14(a) and 14(b) structure an open magnetic circuit structured by the body part and the protruded part and the ratio of magnetic flux passing through the path which is short-cut by the stepped part 64 is large. Therefore, the magnetic flux density at the position apart from the body part 61 is small and influence on the magnetic circuit by its tip end shape of the protruded part is small. Accordingly, variation of the sensor characteristics due to the variation in working of the tip end part of the protruded part is reduced.

Figure 15A:
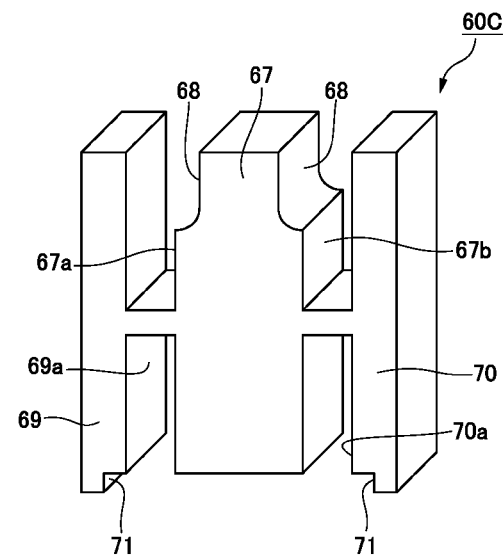
FIGS. 15(a) and 15(b) are explanatory views showing a sensor core in accordance with other embodiments of the present invention.
Figure 15B:
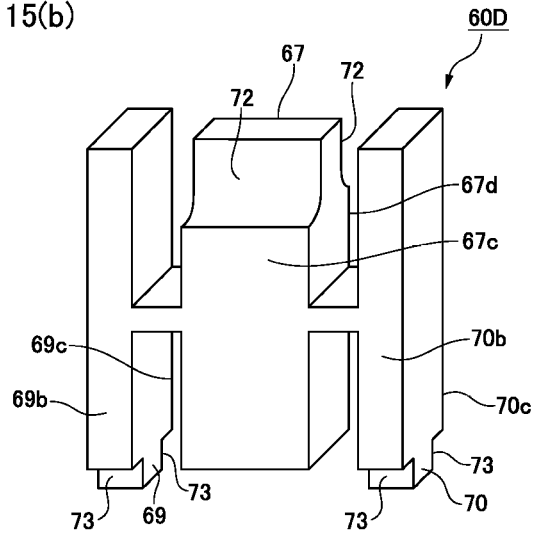

The sensor core 32 in the embodiment described above is a sensor core made of a thin plate-shaped metal foil but the present invention may be applied to a sensor core made of a block body having a certain thickness. The shape of the sensor core is shown in FIGS. 15(a) and 15(b). A sensor core 60C (core body) in FIG. 15(a) is a magnetic body having the same planar shape as the sensor core 32 but has a predetermined certain thickness. A center protruded part 67 extended upward is formed in a rectangular prism shape having a certain thickness and stepped parts 68 are formed on side faces 67a and 67b in the widthwise direction of the protruded part 67. Further, a stepped part 71 is formed on side faces 69a and 70a of protruded parts 69 and 70 which are extended downward on both sides of the center. The tip end face of the protruded part 67 is a sensing face and the tip end faces of the protruded parts 69 and 70 are a grounding face. According to this structure, similarly to the embodiment described above, magnetic flux density at the tip end of the protruded part is reduced.

FIG. 15 (b) is a view showing another example of a shape of a sensor core having a certain thickness. In the sensor core 60D made of a magnetic body, a stepped part 72 which is formed by cutting off the magnetic body in its thickness direction is formed on a front face 67c and a rear face 67d of a protruded part 67 which is extended upward. Further, a stepped part 73 which is formed by cutting off the magnetic body in the thickness direction is also formed on front faces 69b and 70b and rear faces 69c and 70c of protruded parts 69 and 70 which are extended downward. According to this embodiment of the present invention, similarly to the embodiment described above, magnetic flux passing through the tip ends of the respective protruded parts on which the stepped parts 72 and 73 are formed is reduced to make the magnetic flux density small. Therefore, variation of the sensor characteristics due to variation in working of the tip end of the protruded part can be reduced.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A magnetic sensor device comprising a magnetic sensor element structured to detect a magnetic property of a medium, wherein the magnetic sensor element comprises:
a sensor core having a body part and one or a plurality of protruded part(s) which is protruded from the body part;
an exciting coil which is wound around the sensor core; and
a detection coil which is wound around the sensor core,
the body part and the protruded part of the sensor core forms an open magnetic path, and
a stepped part is formed on a side face of at least one piece of the protruded part;
wherein a tip end face of the protruded part where the stepped part is formed is a sensing face of the magnetic sensor element;
wherein a portion on a tip end side of the protrude part with respect to the stepped part is formed so that a width dimension in a direction perpendicular to a protruding direction of the protruded part from the body part is thinner than the width dimension of a portion on a body part side of the protruded part with respect to the stepped part;
the exciting coil is wound around the body part, and
the detection coil is wound around the portion on the tip end side of the protruded part with respect to the stepped part, the portion on the tip end side of the protruded part being extended in a straight line shape.

2. The magnetic sensor device according to claim 1, wherein the tip end face of the protruded part is a grinding worked face which is formed by grinding a sensor core substrate.

3. A magnetic sensor device comprising a magnetic sensor element structure to detect a magnetic property of a medium, wherein the magnetic sensor element comprises:
a sensor core having a body part and one or a plurality of protruded part(s) which is protruded from the body part;

an exciting coil which is wound around the sensor core; and a detection coil which is wound around the sensor core, the body part and the protruded part of the sensor core forms an open magnetic path, and a stepped part is formed on a side face of at least one piece of the protruded part;

wherein a tip end face of the protruded part where the stepped part is formed is a sensing face of the magnetic sensor element;

wherein a portion on a tip end side of the protruded part with respect to the stepped part is formed so that a width dimension in a direction perpendicular to a protruding direction of the protruded part from the body part is thinner than the width dimension of a portion on a body part side of the protruded part with respect to the stepped part;

wherein the protruded part where the stepped part is formed comprises:

lower side face portions which structure both side faces in a widthwise direction of a root part which is disposed on the body part side of the protruded part;

stepped face portions as the stepped part which are extended upward from upper ends of the lower side face portions while curved to inner sides in the widthwise direction of the protruded part; and side face tip end portions which are extended from upper ends of the stepped face portions in a straight line shape to the tip end face of the protruded part; and the width dimension between the side face tip end portions is thinner than the width dimension between the lower side face portions.

4. The magnetic sensor device according to claim 3, wherein the exciting coil is wound around the body part on both sides of the root part having the lower side face portions which is the body part side of the protruded part, and the detection coil is wound around the side face tip end portions of the protruded part.

5. The magnetic sensor device according to claim 4, wherein the magnetic sensor element comprises a core body having a three layer structure which is comprised of a first and a second protection plates made of nonmagnetic material and the sensor core which is sandwiched by the first and the second protection plates, and the exciting coil and the detection coil are respectively wound around the core body through a coil bobbi.

6. A magnetic sensor device comprising a magnetic sensor element structure to detect a magnetic property of a medium, wherein the magnetic sensor element comprises:

a sensor core having a body part and one or a plurality of protruded part(s) which is protruded from the body part;

an exciting coil which is wound around the sensor core; and a detection coil which is wound around the sensor core, the body part and the protruded part of the sensor core forms an open magnetic path, and a stepped part is formed on a side face of at least one piece of the protruded part;

wherein a tip end face of the protruded part where the stepped part is formed is a sensing face of the magnetic sensor element;

wherein the sensor core is provided with a plurality of the protruded parts which are protruded to the same side from the body part, at least one side faces facing each other of the two protruded parts adjacent to each other is formed with the stepped part, and a width of a gap between the side faces facing each other at a position on a tip end side with respect to the stepped part is wider than its width at a position on a body part side with respect to the stepped part;

wherein the protruded part comprises a center protruded part and a first protruded part and a second protruded part which are disposed on both sides with respect to the center protruded part, the center protruded part, the first protruded part and the second protruded part are protruded in the same direction from the body part and are extended in a straight shape so as to be parallel to each other, a width dimension in a direction, which is perpendicular to a protruding direction from the body part, of a portion extended in a straight shape of the center protruded part on a tip end side with respect to the stepped part is thinner than a portion extended in a straight shape of the center protruded part on a body part side with respect to the stepped part;

wherein the exciting coil is wound around the body part, and the detection coil is wound around a portion extended in a straight shape on a tip end side of the center protruded part with respect to the stepped part.

7. The magnetic sensor device according to claim 6, wherein the magnetic sensor element comprises a core body having a three layer structure which is comprised of a first and a second protection plates made of nonmagnetic material and the sensor core which is sandwiched by the first and the second protection plates, and the exciting coil and the detection coil are respectively wound around the core body through a coil bobbin.

8. A magnetic sensor device comprising a magnetic sensor element structured to detect a magnetic property of a medium, wherein the magnetic sensor element comprises:

a sensor core having a body part and one or a plurality of protruded part(s) which is protruded from the body part;

an exciting coil which is wound around the sensor core; and a detection coil which is wound around the sensor core, the body part and the protruded part of the sensor core forms an open magnetic path, and a stepped part is formed on a side face of at least one piece of the protruded part;

wherein a tip end face of the protruded part where the stepped part is formed is a sensing face of the magnetic sensor element;

wherein the sensor core is provided with a plurality of the protruded parts which are protruded to the same side from the body part, at least one of side faces facing each other of the two protruded parts adjacent to each other is formed with the stepped part, and a width of a gap between the side faces facing each other at a position on a tip end side with respect to the stepped part is wider than its width at a position on a body part side with respect to the stepped part;

wherein the protruded part comprises a center protruded part and a first protruded part and a second protruded part which are disposed on both sides with respect to the center protruded part, the center protruded part, the first protruded part and the second protruded part are protruded in the same direction from the body part and are extended in a straight shape so as to be parallel to each other, a width dimension in a direction, which is perpendicular to a protruding direction from the body part, of a portion extended in a straight shape of the center protruded part on a tip end side with respect to the stepped part is thinner than a portion extended in a straight shape of the center protruded part on a body part side with respect to the stepped part;

wherein the center protruded part comprises:

lower side face portions which structure both side faces in a widthwise direction of a root part which is disposed on the body part side;

stepped face portions as the stepped part which are extended upward from upper ends of the lower side face portions while curved to inner sides in the widthwise direction of the protruded part; and side face tip end portions which are extended from upper ends of the stepped face portions in a straight line shape to the tip end face of the center protruded part; and the width dimension between the side face tip end portions is thinner than the width dimension between the lower side face portions.

9. The magnetic sensor device according to claim 8, wherein the exciting coil is wound around the body part, and the detection coil is wound around the side face tip end portions of the center protruded part.

10. A magnetic sensor device comprising a magnetic sensor element structured to detect a magnetic property of a medium, wherein the magnetic sensor element comprises:

a sensor core having a body part and one or a plurality of protruded part(s) which is protruded from the body part;

an exciting coil which is wound around the sensor core; and a detection coil which is wound around the sensor core, the body part and the protruded part of the sensor core forms an open magnetic path, and a stepped part is formed on a side face of at least one piece of the protruded part;

wherein a tip end face of the protruded part where the stepped part is formed is a grounding face for being contacted with an electrical conduction member for grounding;

wherein the protruded part where the stepped part is formed is protruded from the body part to a side opposite to a sensing face of the magnetic sensor element.

11. The magnetic sensor device according to claim 10, wherein the tip end face of the protruded part is a cutting worked face which is formed by cutting a sensor core substrate.

12. A magnetic sensor device comprising a magnetic sensor element structured to detect a magnetic property of a medium, wherein the magnetic sensor element comprises:

a sensor core having a body part and one or a plurality of protruded part(s) which is protruded from the body part;

an exciting coil which is wound around the sensor core; and a detection coil which is wound around the sensor core, the body part and the protruded part of the sensor core forms an open magnetic path, and a stepped part is formed on a side face of at least one piece of the protruded part;

wherein the protruded part is protruded from one of edges of the body part, another protruded part is protruded from the other of the edges of the body part to an opposite direction, a tip end face of the protruded part protruded from the one of the edges is a sensing face of the magnetic sensor element, a tip end face of the protruded part protruded from the other of the edges is a grounding face for being contacted with an electrical conduction member for grounding, and the stepped part is formed on a side face of at least one of the protruded part where the sensing face is formed and the protruded part where the grounding face is formed.

13. The magnetic sensor device according to claim 12, wherein the protruded part which structures the sensing face of the magnetic sensor element comprises a center protruded part and a first protruded part and a second protruded part which are disposed on both sides with respect to the center protruded part, the center protruded part, the first protruded part and the second protruded part are protruded in the same direction from the body part and are extended in a straight shape so as to be parallel to each other, a width dimension in a direction, which is perpendicular to a protruding direction from the body part, of a portion extended in a straight shape of the center protruded part on a tip end side with respect to the stepped part is thinner than a portion extended in a straight shape of the center protruded part on a body part side with respect to the stepped part, and the protruded part which is protruded from the other of the edges comprises a center protruded part and a first protruded part and a second protruded part which are disposed on both sides with respect to the center protruded part, the center protruded part, the first protruded part and the second protruded part being protruded in the same direction from the body part and, the center protruded part, the first protruded part and the second protruded part being extended in a straight shape so as to be parallel to each other.

14. The magnetic sensor device according to claim 13, wherein the exciting coil is wound around the body part, and the detection coil is wound around a thinner portion disposed on a tip end side with respect to the stepped part of the center protruded part which structures the sensing face of the magnetic sensor element.

15. The magnetic sensor device according to claim 14, wherein the exciting coil is wound around the body part at two positions on both sides with respect to the two center protruded parts, and one of the exciting coils is disposed on an inner side with respect to the two first protruded parts and the other of the exciting coils is disposed on an inner side with respect to the two second protruded parts.

16. The magnetic sensor device according to claim 15, wherein the magnetic sensor element comprises a core body having a three layer structure which is comprised of a first and a second protection plates made of nonmagnetic material and the sensor core which is sandwiched by the first and the second protection plates, and the exciting coil and the detection coil are respectively wound around the core body through a coil bobbin.

17. A magnetic sensor device comprising a magnetic sensor element structured to detect a magnetic property of a medium, wherein the magnetic sensor element comprises:
  a sensor core having a body part and one or a plurality of protruded part(s) which is protruded from the body part;
  an exciting coil which is wound around the sensor core; and
  a detection coil which is wound around the sensor core, the body part and the protruded part of the sensor core forms an open magnetic path, and a stepped part is formed on a side face of at least one piece of the protruded part;

wherein the sensor core is provided with a plurality of protruded parts which are protruded to the same side from the body part, the stepped part is formed at least one of side faces of two adjacent protruded parts facing each other, and a width of a gap between the side faces at a position on a tip end side with respect to the stepped part is wider than a width of a gap between the side faces at a position on a body part side with respect to the stepped part wherein the sensor core is formed with at least three protruded parts juxtaposed in one row so as to be protruded to the same side from the body part, the protruded part disposed at a center position is formed with a stepped part on both side faces which face the adjacent protruded parts disposed on both sides, widths of gaps between the protruded part disposed at the center position and the adjacent protruded parts disposed on the both sides are wider at a position on a tip end side with respect to the stepped part than widths of the gaps at a position on the body part side with respect to the stepped part.

18. The magnetic sensor device according to claim 17, wherein the tip end face of the protruded part is a cutting worked face which is formed by cutting the sensor core or a grinding worked face which is formed by grinding the sensor core.

* * * * *